United States Patent [19]
Trimberger

[11] Patent Number: 5,847,577
[45] Date of Patent: *Dec. 8, 1998

[54] DRAM MEMORY CELL FOR PROGRAMMABLE LOGIC DEVICES

[75] Inventor: Stephen M. Trimberger, San Jose, Calif.

[73] Assignee: Xilinx, Inc., San Jose, Calif.

[ * ] Notice: The term of this patent shall not extend beyond the expiration date of Pat. No. 5,581,198.

[21] Appl. No.: 758,286

[22] Filed: Nov. 1, 1996

Related U.S. Application Data

[63] Continuation-in-part of Ser. No. 394,092, Feb. 24, 1995, Pat. No. 5,581,198.

[51] Int. Cl.$^6$ .............................. H03K 19/177; G11C 7/00
[52] U.S. Cl. .............................. 326/38; 326/41; 365/228; 711/106
[58] Field of Search ........................ 326/38–40; 365/222, 365/228, 230.03, 230.05, 149; 711/100, 106, 161–162

[56] References Cited

U.S. PATENT DOCUMENTS

| | | |
|---|---|---|
| Re. 34,363 | 8/1993 | Freeman . |
| 3,866,182 | 2/1975 | Yamada et al. ........................ 340/172.5 |
| 4,366,560 | 12/1982 | McDermott et al. .................... 365/228 |
| 4,638,425 | 1/1987 | Hartung .................................. 364/200 |
| 4,642,487 | 2/1987 | Carter . |
| 4,682,306 | 7/1987 | Sakurai et al. ........................... 365/222 |
| 4,706,216 | 11/1987 | Carter ........................................ 365/94 |
| 4,750,155 | 6/1988 | Hsieh ...................................... 365/203 |
| 4,935,896 | 6/1990 | Matsumura et al. .................... 365/187 |
| 5,051,887 | 9/1991 | Berger et al. ........................... 364/200 |
| 5,187,393 | 2/1993 | El Gamal et al. . |
| 5,270,967 | 12/1993 | Moazzami et al. ................. 365/230.06 |
| 5,283,885 | 2/1994 | Hollerbauer ............................ 395/425 |
| 5,375,086 | 12/1994 | Wahlstrom ................................ 326/38 |
| 5,450,608 | 9/1995 | Steele ...................................... 395/800 |
| 5,581,198 | 12/1996 | Trimberger ............................... 326/39 |
| 5,594,698 | 1/1997 | Freeman ................................. 365/222 |

OTHER PUBLICATIONS

R. Sedgewick, "Algorithms", pp. 283–284, Addison–Wesley, 1983.
R. Sedgewick, "Algorithms", pp. 295–303, Addison–Wesley, 1983.
J.F. Wakerly, "Digital Design Principles and Practices" pp. 34–44, Prentice Hall, 1990.
Bradley Felton and Neil Hastie, "2.6 Configuration Data Verification and the Integrity Checking of SRAM–based FPGAs" GEC Plessey Semiconductors, *FPGAs*, W.R. Moore & W. Luk (eds.), 1991, Abingdon EE&C Books, 15 Harcourt Way, Abingdon, OX14 INV, UK, pp. 54–60.
J.F. Wakerly, "Digital Design, Principles and Practices", pp. 255–257, Prentice Hall, 1989.
"Semiconductor Memories", B. Prince, 2nd Edition, pp. 31–39 and pp. 654–655, 1991.

*Primary Examiner*—Jon Santamauro
*Attorney, Agent, or Firm*—Anthony C. Murabito; Wagner Murabito & Hao; Jeanette S. Harms

[57] ABSTRACT

A plurality of DRAM cells are used to store the state of the programmable points in a programmable logical device (e.g., a field programmable gate array or FPGA). An individual DRAM cell is used in conjunction with each programmable interconnect point (PIP) within the FPGA to hold a logical state indicating the connectivity state of the PIP. During a refresh cycle, each DRAM memory cell is loaded with its current logical state in order to maintain this state within the PIP. An information store contains duplicate data for each DRAM cell and this duplicate data is supplied and read during the refresh cycle in order to provide each DRAM cell with its proper logical state. In this manner, the refresh cycle does not alter the logic configuration of its associated FPGA DRAM cell. The information store can be a plurality of DRAM cells or the information store can be of non-volatile memory, for instance, read only memory (ROM), programmable ROM (PROM), erasable PROM (EPROM), electrically erasable PROM (EEPROM), or of non-volatile magnetic storage.

23 Claims, 5 Drawing Sheets

DRAM MEMORY CELL FOR PROGRAMMABLE LOGIC DEVICES

RELATED PATENT APPLICATIONS

The present patent application is a continuation-in-part of patent application Ser. No. 08/394,092 filed Feb. 24, 1995, now U.S. Pat. No. 5,581,198, entitled "Shadow DRAM for Programmable Logic Devices," by Stephen Trimberger, and assigned to the assignee of the present invention.

BACKGROUND OF THE INVENTION

1. Technical Field

The invention relates to a field programmable gate array, and more particularly, to a shadow memory circuit that is adapted to effect and maintain selected interconnection of various logic and other elements in a field programmable gate array.

Description of the Related Art

2. A field programmable gate array (FPGA) is a programmable integrated circuit logic device that consists of a matrix of configurable logic blocks (CLBs) embedded in a programmable routing mesh. The combined programming of the CLBs and routing network define the function of the device. The device is referred to as an FPGA because the array of CLBs contained on the device can be configured and interconnected by the user in the user's facility by means of special hardware and software.

FPGAs are well known in the art. For example U.S. Pat. No. RE 34,363, reissued on 31 Aug. 1993, describes a configurable logic array that includes a plurality of CLBs interconnected in response to control signals to perform a selected logic function, and in which a memory is used to store the particular data used to configure the CLBs. U.S. Pat. No. 4,642,487, issued on 10 Feb. 1987, teaches a special interconnect circuit for interconnecting CLBs in an FPGA without using the general interconnect structure of the FPGA. U.S. Pat. No. 4,706,216, issued on 10 Nov. 1987, describes a configurable logic circuit that includes a configurable combinational logic element, a configurable storage circuit, and a configurable output select logic circuit. U.S. Pat. No. 4,750,155, issued on 7 June 1988, describes a five transistor memory cell for an FPGA that can be reliably read and written.

Each CLB can provide one or more of the functions provided by an AND gate, flip-flop, latch, inverter, NOR gate, exclusive OR gate, as well as combinations of these functions to form more complex functions. The particular function performed by the CLB is determined by control signals that are applied to the CLB from a control logic circuit. The control logic circuit is formed integrally with, and as part of, the integrated circuit on which the CLB is formed. If desired, control information can be stored and/or generated outside of this integrated circuit and transmitted to the CLB. The actual set of control bits provided to each CLB on the integrated circuit depends upon the functions that the CLB and, more globally, the integrated circuit are to perform.

Each CLB typically has a plurality of input and output pins, and a set of programmable interconnect points (PIPs) for each input and output pin. The general interconnect structure of the FPGA includes a plurality of interconnect segments and a plurality of PIPs, wherein each interconnect segment is connected to one or more other interconnect segments by programming an associated PIP. An FPGA also includes an access PIP that either connects an interconnect segment to an input pin or an output pin of the CLB.

Because the PIPs in the FPGA are programmable, any given output pin of a CLB is connectable to any given input pin of any other desired CLB. Thus, a specific FPGA configuration having a desired function is created by selected generation of control signals to configure the specific function of each CLB in an FPGA, together with selected generation of control signals to configure the various PIPs that interconnect the CLBs within the FPGA.

Figure 1:
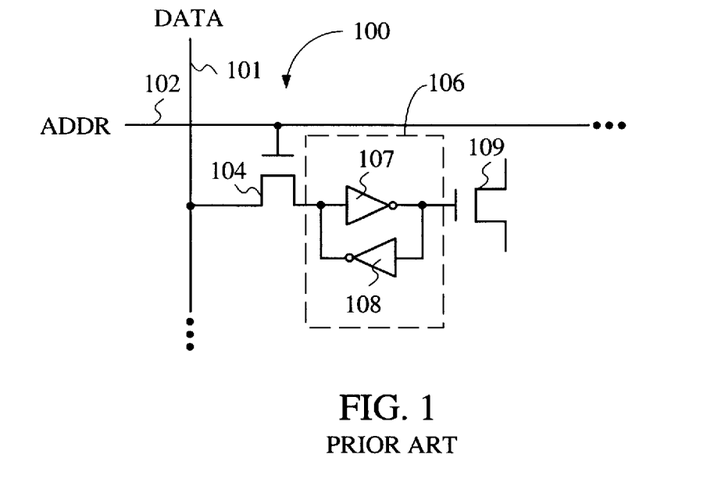
FIG. 1 is a schematic diagram of a prior art SRAM interconnect cell for an FPGA.

Each PIP typically includes a single pass transistor (i.e. effectively a switch). The state of conduction, i.e. whether the switch is opened or closed, is controlled by application of the control signals discussed above to a transistor control terminal, e.g. a gate. The programmed state of each pass transistor is typically latched by a storage device, such as a static random access memory (SRAM) cell 100, illustrated in FIG. 1. As shown in FIG. 1, a high signal ADDR on address line 102 identifies the SRAM cell to be programmed by turning on an n-type pass transistor 104, thereby allowing the desired memory cell state DATA to be transferred from the data line 101 to a latch 106. The state of the control signal stored in the latch 106 determines whether a pass transistor (PIP) 109 is turned on or off, thereby opening or closing a path in the FPGA interconnect.

An SRAM cell is typically used as a storage device because the SRAM cell reliably maintains its value as long as power is supplied. However, as shown in FIG. 1, because SRAM cell 100 includes two inverters 107/108 and a pass transistor 104, SRAM cell 100 requires significant area on an integrated circuit. Typically, the larger the area needed to implement a PIP, the fewer number of PIPs that can be fit onto an integrated circuit.

In view of the continuing trend to increase the number of complex functions implemented by an FPGA, a need arises for a method to reduce the size of the memory cells used to hold the program for the FPGA interconnect, thereby reducing the size of the FPGA and lowering its cost. Further, smaller memory cells would permit larger capacity FPGAs to be built than were previously possible.

A dynamic random access memory (DRAM) cell, which is much smaller than an SRAM cell, has previously not been used in FPGAs for a number of reasons, including:

1. A DRAM cell is volatile and subject to alpha particle upsets that can change the state stored in the cell;
2. A DRAM must be periodically refreshed. Sensing the DRAM cell, for example to refresh the cell, destroys the current value in the cell; and
3. Nearby signals, or signals running over a DRAM cell, can affect the contents of the cell.

SUMMARY OF THE INVENTION

In accordance with the present invention, a plurality of DRAM cells are used to store the state of the programmable points in a programmable logical device (e.g., a field programmable gate array or FPGA). An individual DRAM cell is used in conjunction with each programmable interconnect point (PIP) within the FPGA to hold a logical state indicating the connectivity state of the PIP. In one embodiment, the information store is typically organized with the same number of bits and words as there are FPGA DRAM cells within the FPGA, e.g. there is a one-to-one correspondence between FPGA DRAM cells and the memory cells of the information store. During a refresh cycle, each DRAM memory cell is loaded with its current logical state in order to maintain this state within the PIP. An information store contains duplicate data for each DRAM cell and this duplicate data is supplied and read during the refresh cycle in order to provide each DRAM cell with its proper logical state. In this manner, the refresh cycle does not alter the logic configuration of its associated FPGA DRAM cell. The information store can be a plurality of DRAM cells or the information store can be of non-volatile memory, for instance, read only memory (ROM), programmable ROM (PROM), erasable PROM (EPROM), electrically erasable PROM (EEPROM), or of non-volatile magnetic storage.

The present invention significantly reduces area on the FPGA compared to the area required by prior art memory cells. Furthermore, the present invention also eliminates the need for separate power and ground lines that support prior art memory cells, thereby reducing the number of lines within the FPGA.

DETAILED DESCRIPTION OF THE DRAWINGS

Figure 2:
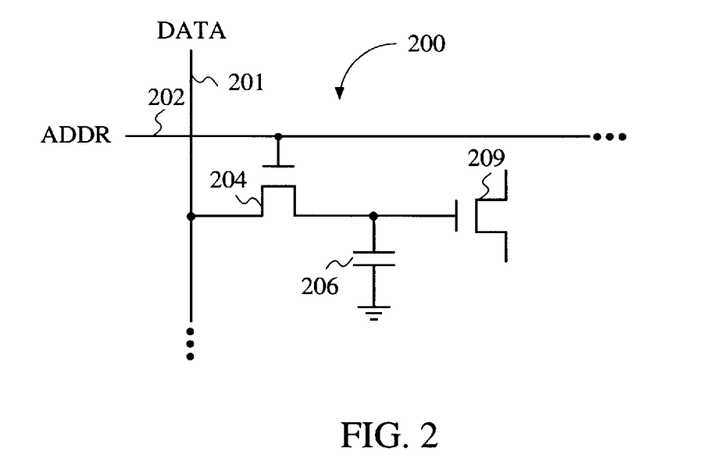
FIG. 2 is a schematic diagram of a DRAM interconnect cell for an FPGA.

FIG. 2 illustrates a DRAM cell 200 for an FPGA in accordance with the present invention. As with SRAM cell 100 (FIG. 1), a high signal ADDR on an address line 202 turns on a first pass transistor 204, thereby allowing a DRAM cell 200 to be programmed. The state stored by DRAM cell 200 is set by a signal DATA supplied over a data line 201. Specifically, if both signals DATA and ADDR are high, then a capacitor 206 begins to charge. The charge stored in capacitor 206 sets the state of the control terminal of the second pass transistor 209, thereby opening or closing a path in the FPGA interconnect. Note that capacitor 206 is implemented either as a separate circuit structure or as the gate of second pass transistor 209.

The present invention significantly reduces area of the FPGA compared to the area required by SRAM cell 100 because DRAM cell 200 stores state information in capacitor 206 (one device), whereas SRAM cell 100 stores state information in latch 106 (four devices). DRAM cell 200 also eliminates the need for separate power and ground lines (not shown in FIG. 1) that support SRAM cell 100 in the prior art, thereby reducing the number of lines within the FPGA.

In accordance with the present invention, a plurality of DRAM cells are used to control the FPGA interconnect circuitry. Another information store (shadow memory) performs a shadow memory function. The shadow memory can be composed of volatile memory cells (e.g., DRAM cells) or it can be composed of non-volatile memory cells. Example non-volatile memory constitution of the shadow memory includes read only memory (ROM), programmable ROM (PROM), erasable PROM (EPROM), electrically erasable PROM (EEPROM), or of non-volatile magnetic storage.

In one embodiment using DRAM as the shadow memory, the shadow memory is typically organized with the same number of bits and words as there are DRAM interconnect cells within the FPGA, i.e. there is a one-to-one correspondence between FPGA DRAM interconnect cells and shadow DRAM memory cells. In this embodiment wherein the shadow memory is DRAM memory, the shadow memory cells are the same as DRAM cell 200 (FIG. 2), with the exception that pass transistor 209 is not required because the shadow memory has no control function.

As is well known to those in the art, while an SRAM cell maintains the state of its contents as long as power is supplied, a DRAM cell needs periodic refreshing.

Figure 3:
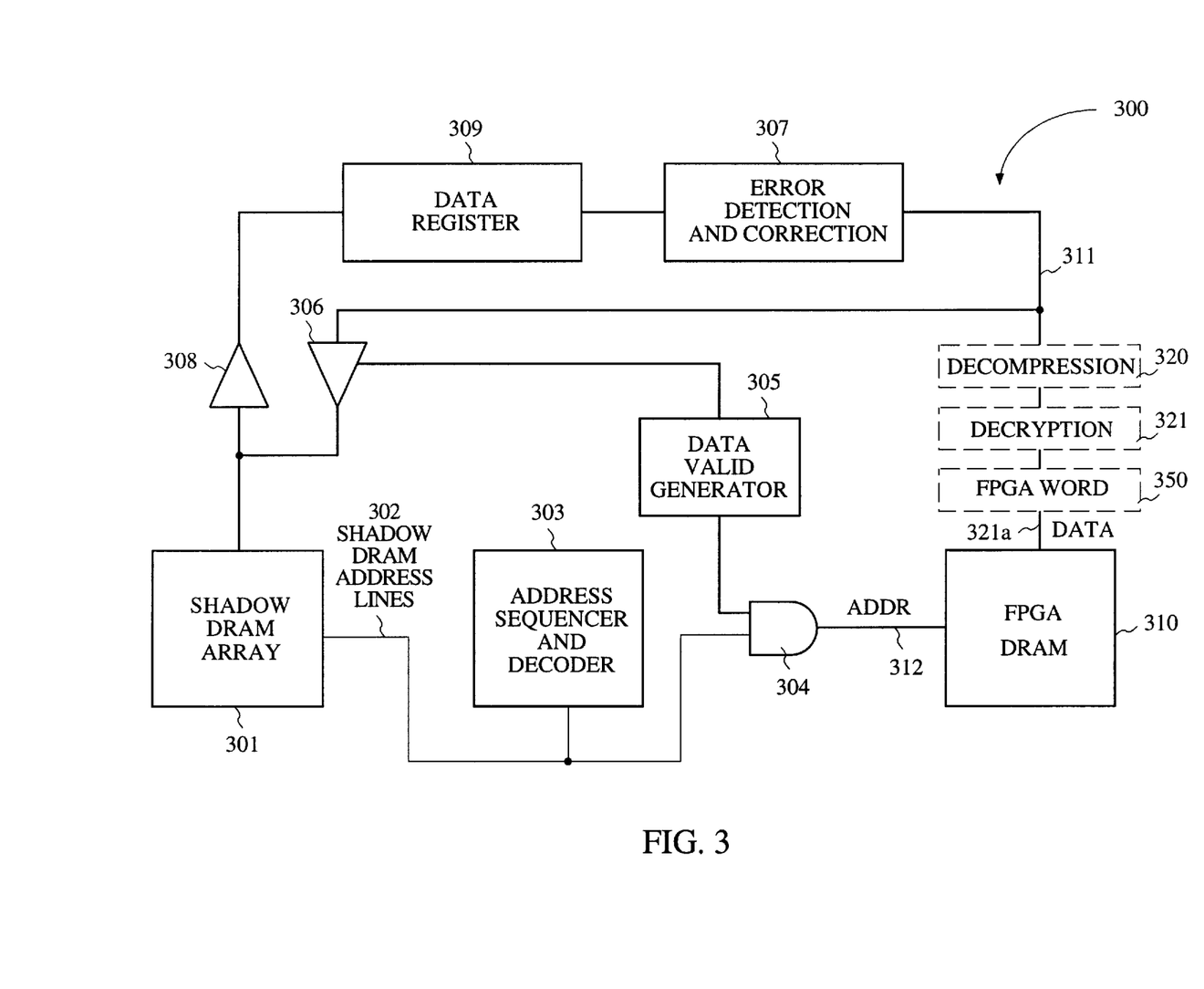
FIG. 3 is a block schematic diagram of a DRAM interconnect control and refresh circuit for an FPGA in accordance with the present invention.

FIG. 3 illustrates a DRAM interconnect control and refresh circuit 300 for an FPGA according to the present invention. A refresh cycle on a data word of the FPGA interconnect DRAM includes the following steps:

1. Initially, a conventional address sequencer and decoder 303 (hereinafter "sequencer") address a particular portion of the shadow memory 301. In one embodiment where the shadow memory is DRAM, the sequencer and decoder 303 pulls one shadow memory address line 302 high to select one word of a shadow memory array 301. The contents of shadow memory array 301 for the current data word are sensed by a conventional sense circuit 308, and read into a data register 309. In embodiments of the present invention where the shadow memory 301 is non-volatile, the conventional sense amplifier 308 can be eliminated and data can be written directly from memory 301 to the data register 309. If shadow memory can be read non-destructively, the write back circuitry including buffer 306 can be eliminated.

2. The contents of data register 309 are written back into the shadow memory array 301 via tri-state buffer 306 (after passing through error detection and correction circuit 307) and these contents are also written into the FPGA interconnect and logic DRAM (hereinafter FPGA DRAM) 310 via data line 311 to refresh FPGA DRAM 310. Shadow memory array 301 and FPGA DRAM 310 are written to simultaneously, independently, or at different intervals, as desired. A preferred embodiment of the present invention provides a simultaneous shadow memory and interconnect DRAM refresh sequence. In that embodiment, sequencer 303 provides address information via lines 302 to shadow memory array 301 and via lines 312 to FPGA DRAM 310.

3. A low DATA VALID signal generated by a data valid circuit 305 (data valid generator circuit), is provided to AND gates 304 to force the signals on bus 312 low. The DATA VALID signal is generated to remain low until the data read out of shadow memory array 301 is latched into data register 309, provided to error detection and correction circuit 307, and propagated to the memory cells in FPGA DRAM 310. A high DATA VALID signal, provided to tri-state buffer 306, allows the transfer of the data held in data register 309 back into shadow memory array 301. In one embodiment, the DATA VALID signal is asserted in a predetermined delay period after the current address is presented over bus 312 by the address sequencer and decoder 303.

Thus, the generation of the DATA VALID signal takes into consideration all internal timing and propagation considerations of the FPGA before FPGA DRAM 310 is refreshed, thereby ensuring that correct data is available to FPGA DRAM 310. The DATA VALID signal ensures that valid data is present over bus 321a during the write cycle when the FPGA DRAM 310 is updated so that transient garbage or invalid data is not written into the FPGA DRAM 310. In this manner, the contents of FPGA DRAM 310 are not destroyed during the interval when the cell is written. A high DATA VALID signal, indicating valid data, and a corresponding high signal on one of address lines 302 forces the output signal from AND gates 304 (i.e. on line 312) high, thereby triggering a refresh cycle and allowing data to be written into the cells of FPGA DRAM 310. Note that a high DATA VALID signal, provided to tri-state buffer 306, permits transfer of the data held in data register 309 to shadow memory array 301. It is appreciated that data valid to 306 and 304 need not be simultaneous.

4. Sequencer 303 which controls the refresh sequence continuously cycles through all addresses to ensure that all DRAM interconnect cells are regularly refreshed.

It is appreciated that the shadow memory array 301, the address sequencer 303, the data valid circuit 305 and gate 304 can be located off-chip in a separate die or device from the FPGA integrated circuit device that contains the FPGA DRAM 310. In this case, the shadow memory array is interfaced to communicate the duplicate data to a receiving circuit (e.g., 308) during a refresh cycle. A number of well known communication interface protocols and circuitry can be used for this alternative embodiment of the present invention. In this alternative embodiment, the data valid circuit 305 operates as discussed above and the address sequencer and decoder 303 address the shared memory array 301 as discussed above. Gate 304 presents the address to receiving circuit 310 to refresh the FPGA DRAM 310 during a valid period of the refresh cycle.

In one embodiment of the present invention, DRAM interconnect control and refresh circuit 300 includes an error detection and correction circuit 307 that minimizes data integrity problems associated with alpha particle hits and other data disturbances of shadow memory array 301. Further description of the codes associated with this conventional circuit is provided in "Digital Design Principles and Practices" by J.F. Wakerly, pages 34–44, 1990, which is herein incorporated by reference. Although shown in connection with the preferred embodiment of the invention, error detection and correction circuit 37 is considered optional.

In contrast to FPGA DRAM 310 which provides a single storage cell at each PIP and therefore is distributed throughout the FPGA, shadow memory array 301 is preferably a standard DRAM array and can therefore be very dense. Shadow memory array 301 is typically built far enough away from lines that carry currents sufficiently high to cause DRAM storage problems. In this manner, the contents of shadow memory array 301 are not disturbed by any FPGA signal, thereby avoiding upset problems and other related interference that might affect the cells of shadow memory array 301. In this way, any errors introduced into the memory cells of FPGA DRAM 310, for example by the routing of various signals through the general interconnect of the FPGA, are readily corrected by shadow memory array 301 during the next refresh cycle. In another embodiment, each cell of the shadow memory array is built at the same location as its associated FPGA DRAM interconnect cell.

One embodiment of the shadow memory array includes DRAM cells because of the compact size of such arrays. In one embodiment of an FPGA in accordance with the invention, a shadow memory array having approximately 100,000 cells is used. In other embodiments of the invention, the shadow memory array uses other technologies. For example, the shadow memory array could be an SRAM, EPROM, EEPROM, flash EPROM, or ferroelectric array. Although the shadow memory array is integrated onto the same die as the FPGA in typical embodiments of the invention, other shadow memory arrays are fabricated on a separate die. Finally, in yet another embodiment of the present invention, a shadow memory is provided for use with standard SRAM interconnect cells, such that these interconnect cells are periodically refreshed to repair any errors that resulted from factors such as power surges.

It is appreciated that more than one read and write cycle can be applied to shadow memory 301 to collect enough bits for one full FPGA DRAM address. In this alternative embodiment, a second register 350 is used to store the full FPGA DRAM word.

Figure 4:
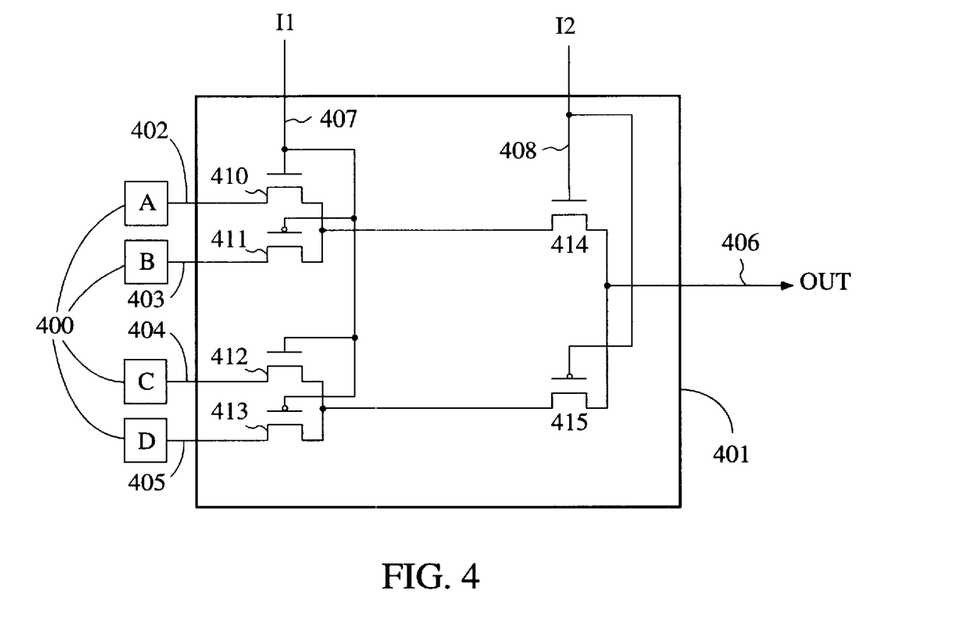
FIG. 4 is a schematic diagram of a prior art logic configuration circuit for an FPGA.

The present invention is also intended for other applications in programmable or configurable devices in which a logic state is set and stored. For example, FIG. 4 illustrates a prior art logic configuration circuit that includes a plurality of storage elements 400 which store logic states A, B, C and D. These logic states, which determine the logic function performed by the circuit, are provided to a multiplexer 401 via lines 402, 403, 404 and 405. Multiplexer 401 consists of a first set of transistors 410, 411, 412, 413 that are controlled by signal I1 provided on a first input line 407, and a second set of transistors 414, 415 that are controlled by a signal I2 provided on a second input line 408. The signals on first input line 407 and second input line 408 select the logic state bit that is the function value on output line 406. For example, assume logic states B, C, and D are a logic "0" and logic state A is a logic "1". Multiplexer 401 selects logic state A when both signals I1 and I2 are a logic "1", the function of the circuit is an AND gate because the function produces a logic "1" only when both inputs are a logic "1", and the circuit produces a logic "0" if either of the signals provided on input lines 407, 408 is otherwise.

Prior art storage elements 400 are typically SRAM cells and, as such, are relatively stable. However, as discussed above, SRAM cells require considerable area on an integrated circuit.

As is known in the art, a DRAM cell cannot source a current for a logic operation because drawing current from the DRAM cell depletes the charge stored in the cell and thus may change the state of the cell. Thus,.a DRAM cell may only store a logic state. Therefore, if a DRAM cell is used for storage cell 400, the contents of the DRAM cell are lost when the cell is sensed. For example, a DRAM cell cannot drive an input line of a steering logic multiplexer and still retain its contents. Accordingly, in one embodiment of the invention, a DRAM cell controls a first multiplexer which in turn provides an input signal to a logic configuration multiplexer.

Figure 5:
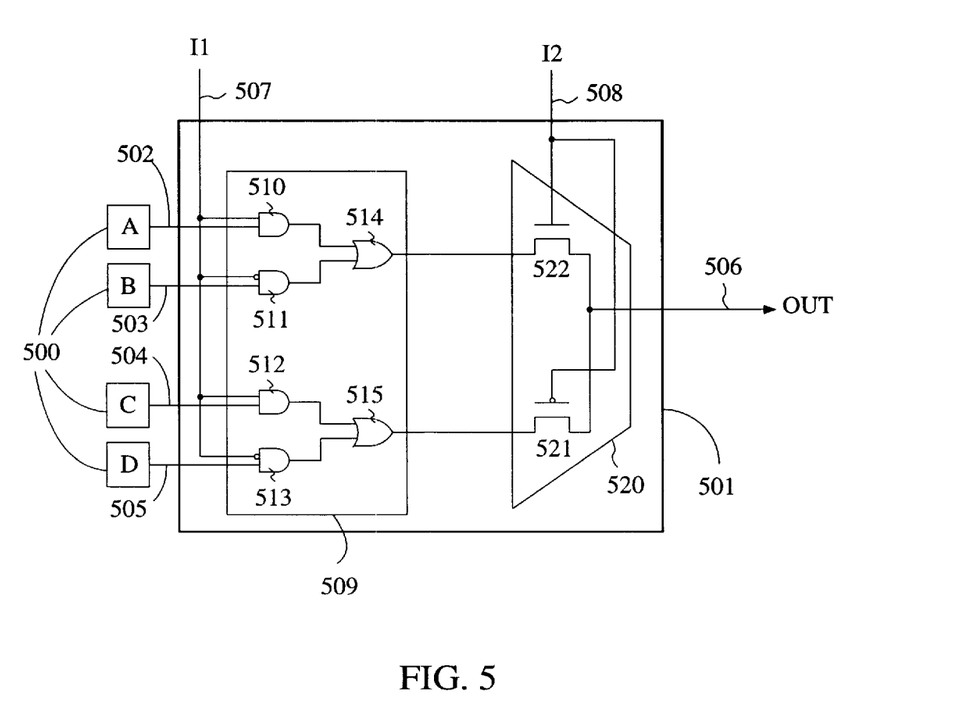
FIG. 5 is a schematic diagram of a logic configuration circuit for an FPGA in accordance with the present invention.

FIG. 5 illustrates a plurality of DRAM storage elements 500 and a logic configuration circuit 501. In this embodiment, DRAM storage elements 500 provide signals to the input terminals of a first multiplexer stage 509. Because storage elements 500 are DRAM cells, multiplexer stage 509 includes logic gates 510–515 rather than steering logic. Specifically, DRAM storage elements 500 control the gates of the transistors in logic gates 510–513. Multiplexer stage 509 is controlled by an input signal I1 provided on line 507 which in turn is also provided to logic gates 510–513. The output terminals of logic gates 510–513 are connected through OR gates 514, 515 to a second multiplexer stage 520 that includes transistors 520, 521. Based on the value of control signal I2, multiplexer 520 provides the selected signal on output line 506.

Figure 6A:
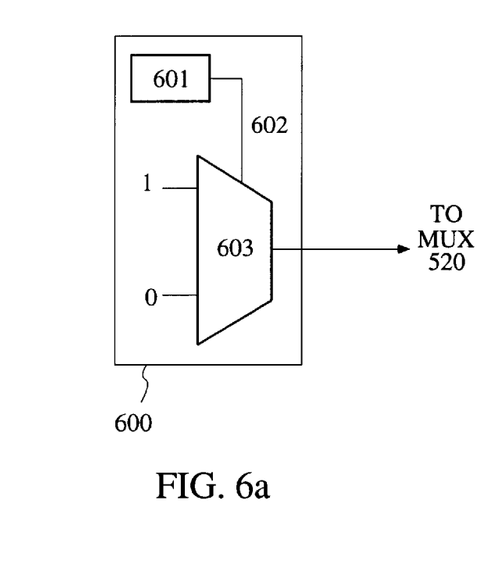
FIGS. 6a and 6b are block schematic diagrams of alternative embodiments of a portion of a storage element circuit in accordance with the present invention.
Figure 6B:
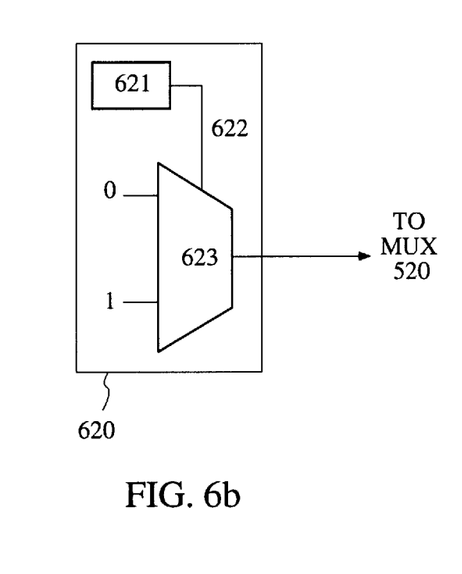

FIGS. 6a and 6b show alternative embodiments of storage elements 400 (FIG. 4). In FIG. 6a, a DRAM storage element 601 is shown having an output state 602 that is provided as a control signal to a multiplexer 603. Both input lines of multiplexer 603 are hardwired such that the state of DRAM storage element 601 controls the output signal of multiplexer 603, and therefore the output of storage circuit 600. FIG. 6b shows a DRAM storage element 621 having an output state 622 that is provided as a control signal to a multiplexer 623. As in FIG. 6a, both input lines of multiplexer 623 are hardwired such that the state of DRAM storage element 621 controls the output signal of multiplexer 623, and therefore the output signal of storage circuit 620.

Figure 7:
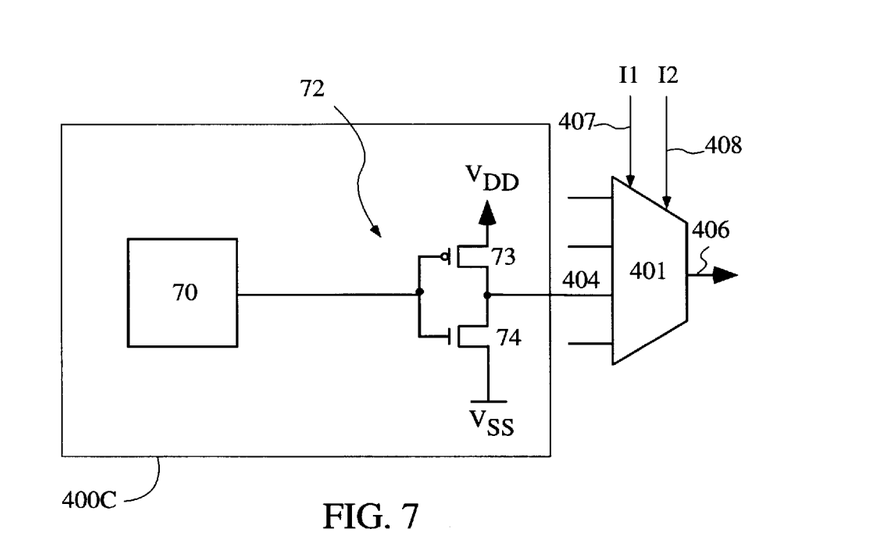
FIG. 7 is a block schematic diagram of a logic configuration circuit for an FPGA having a DRAM configuration element in accordance with the present invention.
Figure 8:
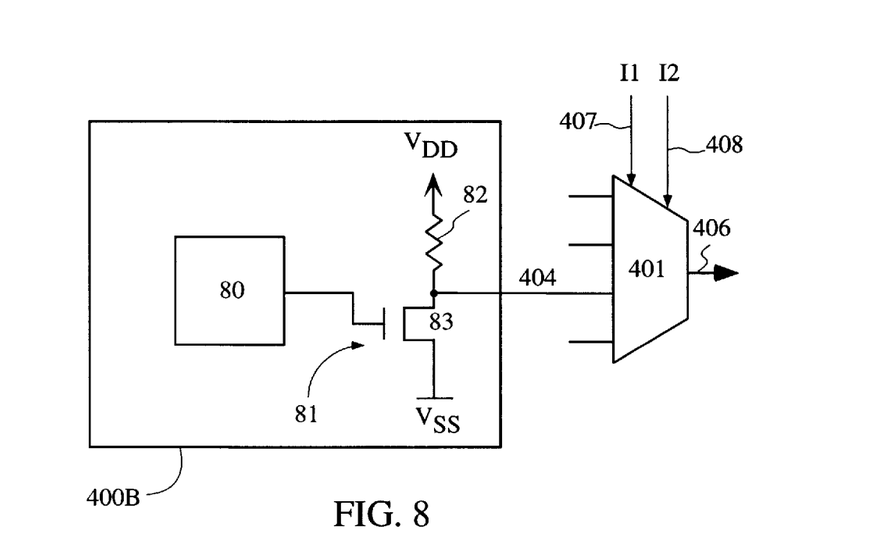
FIG. 8 is a block schematic diagram of another logic configuration circuit for an FPGA having a DRAM configuration element in accordance with the present invention.

In accordance with the embodiments of the invention shown in FIGS. 7 and 8, storage elements 400C and 400B include DRAM cells having an associated shadow memory cell (not shown), such as the shadow memory array 301 discussed above in reference to FIG. 3. In these embodiments, storage elements 400C and 400B are coupled to one of a plurality of address terminals on a programmable logic element, such as multiplexer 401.

Storage element 400C includes a DRAM cell 70 and a multiplexer 72. As shown in FIG. 7, multiplexer 72 is multiplexer 623 implemented as CMOS transistors and simplified to an inverter circuit that consists of a P-channel transistor 73 coupled to a voltage source Vdd and an N-channel transistor 74 coupled to a voltage source Vss, thereby ensuring a rail-to-rail voltage swing on line 404. Storage element 400B includes a DRAM cell 80 according to the invention and a multiplexer 81. In this embodiment of the invention, multiplexer 81 includes an N channel transistor 83 coupled to a voltage source Vss and a pull-up resistor 82 coupled to a voltage source Vdd, thereby ensuring a rail-to-rail voltage swing on line 403.

The use of a DRAM cell to configure a programmable logic element saves considerable area on an integrated circuit die by reducing significantly the number of transistors that must be formed on the die. As with the interconnect application for the invention, in some applications it may be desirable to include a shadow memory for the various DRAM cells that store the logic configuration state.

Although the invention is described herein with reference to various embodiments, those skilled in the art will readily appreciate that other configurations and applications may be substituted for those set forth herein without departing from the spirit and scope of the present invention. For example, referring to FIG. 3, another embodiment of the present invention includes a decompression circuit 320. Decompression circuit 320 uses any conventional decompression algorithms including, for example, Run-Length encoding or Huffman encoding which are explained in detail in R. Sedgewick, *Algorithms,* 283–284, Addison-Wesley, 1983 (incorporated herein by reference). In this embodiment, a plurality of switches as well as a plurality of memory cells associated with the switches are provided. Each memory cell is adapted to set and store one switch state. However, because of decompression circuit 320, the number of shadow memory cells is less than the number of memory cells in the FPGA. In another embodiment, the switch states are encoded in a plurality of shadow memory cells. Therefore, in that embodiment, the present invention includes a decryption circuit 321. Again, any conventional encryption/decryption method is acceptable including, for example, Vigenere cipher and RSA encryption which are explained in detail in *Algorithms,* 295–303 (also incorporated by reference). In yet another embodiment, during one memory access, address sequencer and decoder 303 uses only one line of shadow memory address lines 312, but uses multiple FPGA address lines 312. In other words, one shadow memory cell has an associated plurality of FPGA memory cells. The present invention is set forth in the appended claims.

I claim:

1. A circuit for implementing a programmable interconnect point in a programmable logic device, said circuit comprising:
    a switch;
    a DRAM memory cell associated with said switch, said DRAM memory cell adapted to set and store the state of said switch;
    a receiving circuit for receiving a duplicate value indicative of said state of said switch;
    circuitry for receiving a data valid signal indicating a valid interval in which said duplicate value is to be stored into said DRAM memory cell; and
    circuitry responsive to said valid signal for storing said duplicate value into said DRAM memory cell during a memory refresh cycle.

2. The circuit of claim 1 further comprising a shadow memory array comprising a plurality of memory cells, each memory cell associated with a switch of said programmable logic device and adapted to store said state of said switch in parallel with said DRAM memory cell and also adapted to supply said duplicate value during said memory refresh cycle.

3. The circuit of claim 1 wherein said circuit further comprises:
    a data line for providing a data signal to said programmable interconnect point;
    an address line for providing an address signal to said programmable interconnect point;
    a pass transistor coupled to said data and address lines and adapted to transfer said data signal to said DRAM memory cell if said address signal is provided to said first pass transistor, wherein said switch is operable in response to the state of the data signal stored by said DRAM memory cell.

4. The circuit of claim 2 wherein said plurality of memory cells of said shadow memory array are non-volatile memory cells.

5. The circuit of claim 1 wherein said circuit further comprises a data register for storing said duplicate value during said memory refresh cycle.

6. The circuit of claim 2 wherein said circuit further comprises an address sequencer for continuously addressing said plurality of memory cells of said shadow memory array and corresponding DRAM memory cells during a refresh sequence.

7. The circuit of claim 1 wherein said circuit further comprises a circuit for generating said valid signal during said memory refresh cycle such that said valid signal is asserted when valid data is present at said DRAM memory cell.

8. The circuit of claim 6 wherein said circuit further comprises a circuit for detecting and correcting errors in said plurality of memory cells of said shadow memory array.

9. A circuit for implementing a programmable interconnect point in a programmable logic device, said circuit comprising:

a switch;

a DRAM memory cell associated with said switch, said DRAM memory cell adapted to set and store the state of said switch;

circuitry for receiving a data valid signal indicating a valid interval in which a duplicate value is to be stored into said DRAM memory cell;

circuitry responsive to said data valid signal for storing said duplicate value into said switch during a memory refresh cycle; and a shadow memory array comprising a plurality of non-volatile memory cells, each non-volatile memory cell associated with a respective switch of said programmable logic device and adapted to store said state of said switch in parallel with said DRAM memory cell and adapted to supply said duplicate value during said memory refresh cycle.

10. The circuit of claim 9 wherein said circuit further comprises:

a data line for providing a data signal to said programmable interconnect point;

an address line for providing an address signal to said programmable interconnect point;

a pass transistor coupled to said data and address lines and adapted to transfer said data signal to said DRAM memory cell if said address signal is provided to said first pass transistor, wherein said switch is operable in response to the state of the data signal stored by said DRAM memory cell.

11. The circuit of claim 9 wherein said circuit further comprises a data register for storing said duplicate value during said memory refresh cycle.

12. The circuit of claim 9 wherein said circuit further comprises an address sequencer for continuously addressing said plurality of non-volatile memory cells of said shadow memory array and corresponding DRAM memory cells during a refresh sequence.

13. The circuit of claim 9 wherein said circuit further comprises a circuit for generating said valid signal during said memory refresh cycle such that said valid signal is asserted when valid data is present at said DRAM memory cell.

14. The circuit of claim 13 wherein said circuit further comprises a circuit for detecting and correcting errors in said plurality of non-volatile memory cells of said shadow memory array.

15. A method for maintaining a state of a switch of a programmable interconnect point in a programmable logic device, said method comprising the steps of:

controlling said switch with a DRAM memory cell associated with said switch, said DRAM memory cell adapted to set and store the state of said switch;

receiving from a memory array a duplicate value indicative of said state of said switch;

generating a data valid signal indicating a valid interval in which said duplicate value is to be stored into said DRAM memory cell; and responsive to said data valid signal, storing said duplicate value into said DRAM memory cell during a memory refresh cycle.

16. The method of claim 15 further comprising the step of:

providing a data signal over a data line to said programmable interconnect point;

providing an address signal over an address line to said programmable interconnect point; and transferring said data signal to said DRAM memory cell over a pass transistor coupled to said data and address lines provided said address signal is provided to said pass transistor, wherein said switch is operable in response to the state of the data signal stored by said DRAM memory cell.

17. The method of claim 15 further comprising the step of storing said duplicate value during said memory refresh cycle in a data register circuit.

18. The method of claim 15 further comprising the step of continuously addressing said memory array and corresponding DRAM memory cells of programmable interconnect points during a refresh sequence via an address sequencer.

19. The method of claim 15 further comprising the step of generating said valid signal during said memory refresh cycle such that said valid signal is asserted when valid data is present at said DRAM memory cell.

20. The method of claim 19 further comprising the step of detecting and correcting errors in data supplied by said memory array.

21. The method of claim 15 wherein said memory array comprises non-volatile memory cells.

22. A circuit for implementing a programmable interconnect point in a programmable logic device, said circuit comprising:

a switch;

a memory cell associated with said switch, said memory cell adapted to set and store the state of said switch;

a receiving circuit for receiving a duplicate value indicative of said state of said switch;

circuitry for receiving a data valid signal indicating a valid interval in which said duplicate value is to be stored into said memory cell; and circuitry responsive to said valid signal for storing said duplicate value into said memory cell during a memory refresh cycle.

23. The circuit of claim 22 further comprising a shadow memory array comprising a plurality of memory cells, each memory cell associated with a switch of said programmable logic device and adapted to store said state of said switch in parallel with said memory cell and also adapted to supply said duplicate value during said memory refresh cycle.

* * * * *